(12) United States Patent
Nakanishi et al.

(10) Patent No.: US 6,784,528 B2
(45) Date of Patent: Aug. 31, 2004

(54) SEMICONDUCTOR DEVICE WITH PLATING WIRING CONNECTING IC ELECTRODE PAD TO TERMINAL

(75) Inventors: Hiroyuki Nakanishi, Kitakatsuragi-gun (JP); Toshiya Ishio, Nabari (JP); Katsunobu Mori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/269,074

(22) Filed: Oct. 11, 2002

(65) Prior Publication Data

US 2003/0111721 A1 Jun. 19, 2003

(30) Foreign Application Priority Data

Dec. 14, 2001 (JP) ........................................ 2001-382098

(51) Int. Cl.⁷ .............................................. H01L 23/02
(52) U.S. Cl. ........................ 257/686; 257/701; 257/787; 257/750; 257/763
(58) Field of Search .................................. 257/685, 686, 257/701, 702, 787, 786, 784, 698, 696, 777, 668, 723, 750, 763

(56) References Cited

U.S. PATENT DOCUMENTS

| | | | | |
|---|---|---|---|---|
| 5,023,697 A | * | 6/1991 | Tsumura | ...................... 257/780 |
| 5,293,066 A | * | 3/1994 | Tsumura | ...................... 257/668 |
| 6,140,583 A | * | 10/2000 | Suzuki et al. | .............. 174/68.1 |
| 6,392,143 B1 | * | 5/2002 | Koshio | ....................... 174/52.4 |

FOREIGN PATENT DOCUMENTS

JP            63271939 A    * 11/1988         H01L/21/312

* cited by examiner

*Primary Examiner*—Nathan J. Flynn
*Assistant Examiner*—Pershelle L Greene
(74) *Attorney, Agent, or Firm*—Nixon & Vanderhye P.C.

(57) ABSTRACT

In order to simplify a providing method of a wiring that electrically connects a semiconductor integrated circuit to a substrate, the semiconductor integrated circuit that is covered with an insulating layer except for an electrode area having an electrode pad is fixed on a formation side of the substrate having a terminal connected to the semiconductor integrated circuit so that the electrode pad is exposed. Next, a metallic thin film is provided on a wiring area on which a wiring for electrically connecting the electrode pad to the terminal is provided. Further, the wiring is provided on the metallic film of the wiring area in accordance with plating.

9 Claims, 13 Drawing Sheets

SEMICONDUCTOR DEVICE WITH PLATING WIRING CONNECTING IC ELECTRODE PAD TO TERMINAL

FIELD OF THE INVENTION

The present invention relates to a semiconductor device using a semiconductor integrated circuit, a stacked type semiconductor device, and a manufacturing method of a semiconductor device.

BACKGROUND OF THE INVENTION

In a field of a compact portable electric device, performance of electric parts installed in an electric device has been improved as well as miniaturization and weight saving thereof. In order to realize high performance of the electric parts as well as the miniaturization thereof, the electric parts are packaged in a highly dense manner, and a limited space in the electric device is efficiently used.

Discrete electric parts such as a semiconductor integrated circuit, a chip resistor, and a chip capacitor are provided on a substrate, and they are packaged on an electric device in combination with the substrate. Then, it may be advantageous that: by using a substrate whose rigidity is low and flexibility is high so as to freely bend the substrate, a space in the electric device is efficiently used. The substrate is bent, which causes the discrete electric part provided in the substrate to be bent, so that it is necessary to process the discrete electric part itself so as to be freely bent.

Japanese Unexamined Patent Publication No. 277683/2000 (Tokukai 2000-277683, Publication date: Oct. 6, 2000, corresponding U.S. Pat. No. 6,392,143, Date of Patent: May 21, 2002) discloses a semiconductor device such that: a semiconductor integrated circuit therein is made extremely thin, so that the substrate can be bent and the semiconductor integrated circuit can be curved. The semiconductor device disclosed in the publication can be packaged on a curved surface because the semiconductor integrated circuit and the substrate that are superior in the flexibility are used.

However, in the semiconductor device of Tokukai 2000-277683, complicated manufacturing step and a long time are required in electrically connecting the semiconductor integrated circuit to the substrate.

Figure 12:
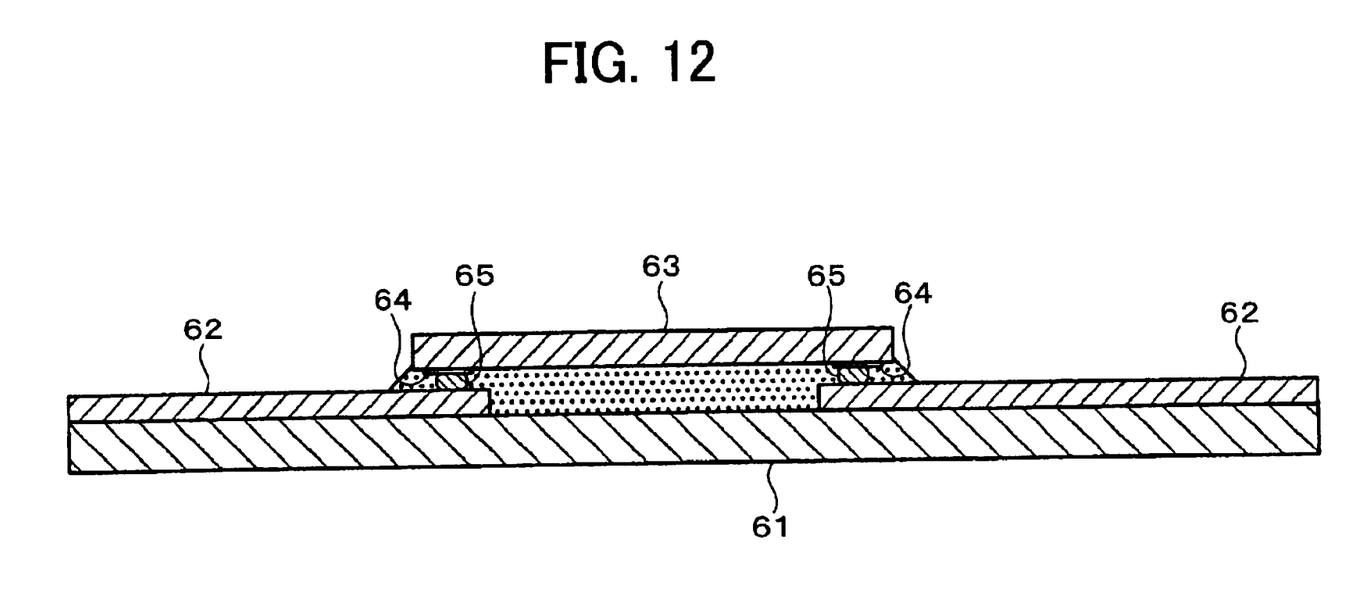
FIG. 12 is a cross sectional view showing a conventional semiconductor device.
Figure 13:
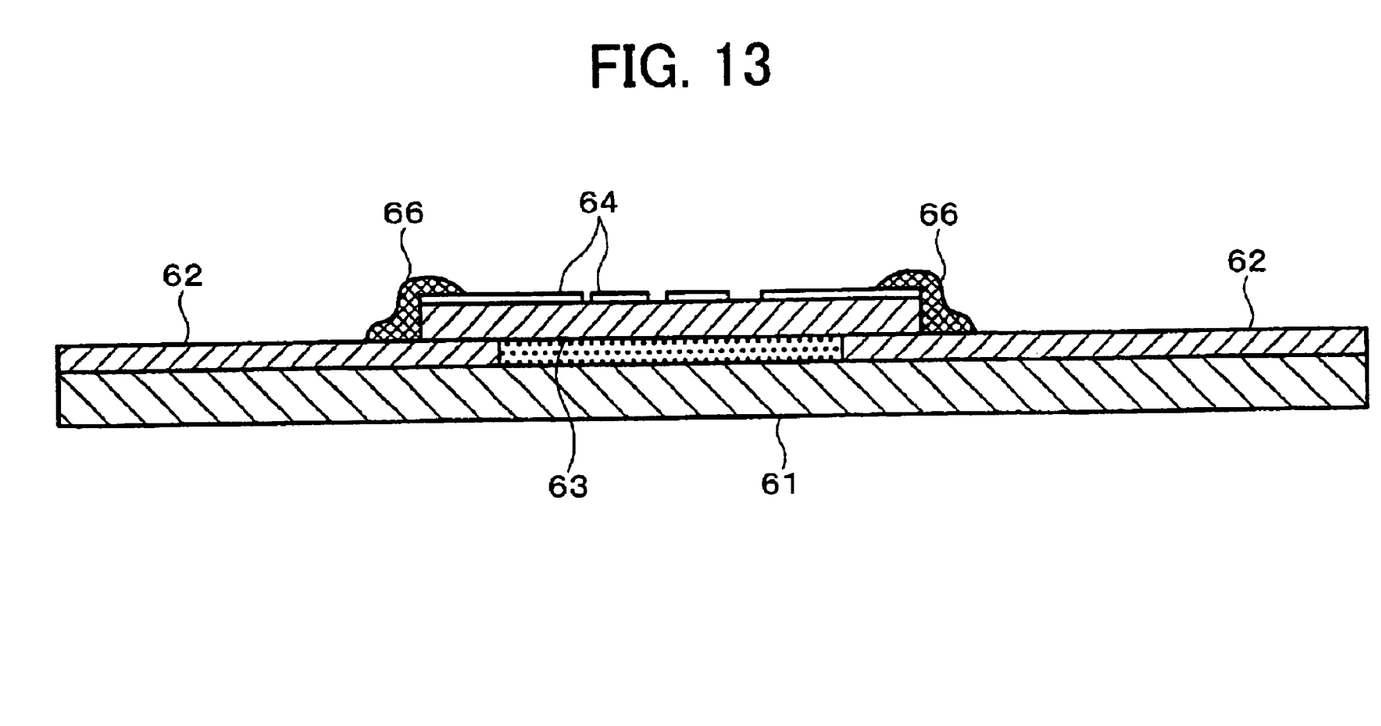
FIG. 13 is a cross sectional view showing a conventional semiconductor device.

That is, as shown in FIG. 12 and FIG. 13, the semiconductor device of the foregoing publication is arranged by using a gold bump 65 (FIG. 12) or a solder 66 (FIG. 13) as a connection wiring that connects an externally connecting terminal 62 provided on a substrate 61 to an electrode pad 64 provided on a semiconductor integrated circuit 63. In a case where the gold bump 65 is used as the connection wiring, it is necessary to provide the gold bump 65 on a semiconductor integrated circuit 63 before providing the semiconductor integrated circuit on the substrate 61. Therefore, a manufacturing step for forming the gold bump 65 is required, so that a time taken to manufacture the semiconductor device is increased. Further, in a case where the solder bump 66 is used as the connection wiring, it is necessary to apply solder to a connection point between a metallic wiring 62 and the electrode pad 64, so that the manufacturing step is complicated.

SUMMARY OF THE INVENTION

The object of the present invention is to provide a semiconductor device and a stacked type semiconductor device that can realize miniaturization of an electric device by providing with a semiconductor integrated circuit and a substrate superior in the flexibility so as to efficiently use a space in the electric device, and to provide a manufacturing method of the semiconductor device in which it is possible to shorten a time taken to manufacture the semiconductor device by simplifying a providing method of a wiring that electrically connects the semiconductor integrated circuit to the substrate.

In order to solve the foregoing problem, the semiconductor manufacturing method of the present invention includes the steps of: (i) fixing a semiconductor integrated circuit, that is covered with an insulating layer except for an electrode area having an electrode, on a formation side of a substrate having a connection portion connected to the semiconductor integrated circuit so that the electrode is exposed; (ii) providing a base metallic film on a wiring area on which a wiring for electrically connecting the electrode to the connection portion is provided; and (iii) providing the wiring on the base metallic film of the wiring area in accordance with plating.

According to the method, the semiconductor integrated circuit is fixed on the substrate, and plating is performed on the base metallic film of the wiring area, so that a plating metal is deposited on the base metallic film so as to constitute the wiring. Thus, it is possible to electrically connect the connection portion on the substrate to the semiconductor integrated circuit. Therefore, it is not necessary that the substrate is connected to the semiconductor integrated circuit in accordance with a step of providing the wiring on the semiconductor integrated circuit in advance or in accordance with a step of applying a solder to a joint between the substrate and the semiconductor integrated circuit like conventional methods, but it is possible to readily provide the wiring in accordance with the plating. As a result, manufacturing steps of the semiconductor device are simplified, and a time taken to manufacture the semiconductor device is shortened, so that it is possible to reduce the manufacturing cost.

Further, the semiconductor device of the present invention includes: a substrate whose formation side has a connection member thereon; a semiconductor integrated circuit, having an electrode and covered with an insulating layer except for an electrode area having the electrode, which is fixed on the formation side so that the electrode area is exposed; and a wiring that is provided in accordance with plating so as to electrically connect the electrode to the connection member.

According to the arrangement, the electrode is connected to the connection member via the wiring constituted of the plating, so that it is possible to obtain the semiconductor device that can be easily manufactured. Further, the wiring is provided in accordance with the plating, so that it is possible to provide the semiconductor device that realizes a lower cost.

Note that, the connection member is a member, provided on the formation side of the substrate, that is electrically connected to the electrode of the semiconductor integrated circuit via the wiring. Examples of the connection member include a terminal connected to an external device, an electrode of another semiconductor integrated circuit, and a discrete electric part, such as a resistor and a capacitor, other than the semiconductor integrated circuit.

For a fuller understanding of the nature and advantages of the invention, reference should be made to the ensuing detailed description taken in conjunction with the accompanying drawings.

BRIEF DESCRIPTION OF THE DRAWINGS

FIG. 7b shows another embodiment of the semiconductor device of the present invention, and is a cross sectional view taken along line Y–Y' of FIG. 7a.

FIG. 9b shows the stacked type semiconductor device of the present invention, and is a cross sectional view taken along line Z–Z' of FIG. 9a.

FIG. 10b shows the first semiconductor device that constitutes the stacked type semiconductor device of the present invention, and is a cross sectional view taken along line P–P' of the first semiconductor device shown in FIG. 10a.

FIG. 11b shows the second semiconductor device that constitutes the stacked type semiconductor device of the present invention, and is a cross sectional view taken along line Q–Q' of FIG. 11a.

DESCRIPTION OF THE EMBODIMENTS

[Embodiment 1]

One embodiment of the present invention is described as follows.

First, a manufacturing method of a semiconductor device of the present embodiment is described. Note that, a manufacturing step and a manufacturing condition of the semiconductor device of the present embodiment does not differ from a manufacturing step and a manufacturing condition at which a semiconductor device is typically manufactured, so that detail description thereof is omitted except for a special case.

Figure 2A:
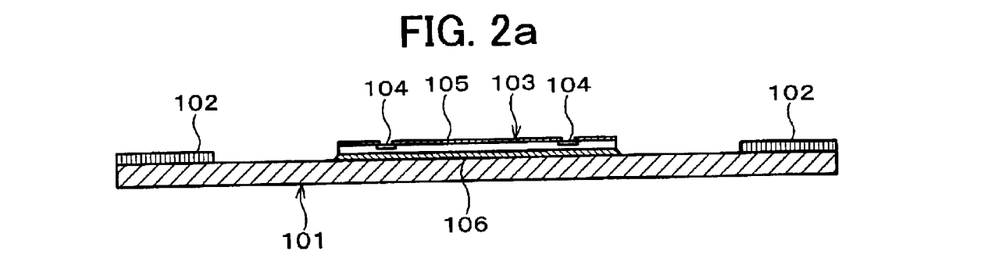

A semiconductor integrated circuit (hereinbelow referred to as IC) 103, shown in FIG. 2a, that is used in the present embodiment is made of silicon (Si) or SOI (Silicon on insulator) so as to have a 5 μm thickness. Since the IC 103 is made extremely thin, the IC 103 has the flexibility that enables it to be freely bent. As shown in FIG. 2a, the IC 103 includes an electrode pad 104 thereon as an electrode, and an insulating oxide film (insulating layer) 105 covers a top face of the IC so that the electrode pad 104 is exposed. The electrode pad 104 is made of alminium (Al). Note that, in the IC 103, hereinbelow a side where the electrode pad 104 is exposed is referred to as IC upper face, and a side parallel to the IC upper face is referred to as IC lower face. Further, a side that is positioned vertically with respect to the IC upper face and the IC lower face and in a direction of thickness of the IC 103 is referred to as side face.

Further, the substrate 101 is a substrate on which the IC 103 is provided. A connection terminal 102 is provided on a substrate upper face (formation side) of the substrate 101 as a conductive part that has been subjected to patterning, and the connection terminal 102 and the IC 103 are electrically connected to each other as described later. A base part of the substrate 101 is made of material superior in the flexibility. In the present embodiment, the base part is made of polyimide having a 10 μm thickness. Further, an adhesive 106 having thermosetting property is printed on a predetermined portion of the substrate upper face, and the IC 103 is provided on this portion. Note that, in the substrate 101, hereinbelow a side where the IC 103 is provided is referred to as a substrate upper face.

Further, the thermosetting resin adhesive 106 is used so as to fix the IC 103 in the foregoing description, but the arrangement is no limited to this, and thermoplastic resin adhesive may be used. That is, for example, the thermoplastic resin adhesive and a thermoplastic resin sheet may be used as thermoplastic resin so as to fix the IC 103.

In the present embodiment, in order to manufacture the semiconductor device which can be bent, the IC 103 and the substrate 101 have the flexibility, but this is applicable to a case of manufacturing a semiconductor device which is not bent. That is, in a case where a semiconductor device having no flexibility is manufactured, there is no problem even when the IC 103 and the substrate 101 have no flexibility.

The IC 103 is provided on the adhesive 106 on the substrate upper face of the substrate 101 so that the IC lower face is in contact with the adhesive 106, and is heated in an oven while the IC 103 is lightly held with a mounting tool. Since the adhesive 106 has the thermosetting property, it is cured by heating, so that the IC 103 is bonded and fixed to the substrate upper face as shown in FIG. 2a.

Figure 2B:
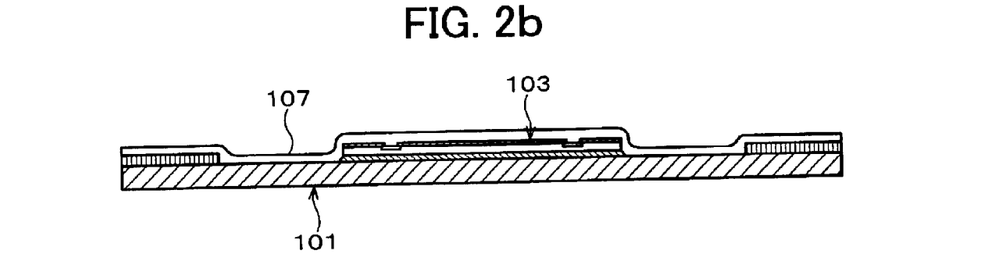
FIG. 2b through FIG. 2d illustrate the manufacturing step of the semiconductor device of the present invention, and each of the figures is a cross sectional view for illustrating a step of providing an insulating film on the semiconductor integrated circuit.

Next, as shown in FIG. 2b, a negative type photosensitive polymer 107 is entirely applied to the IC upper face of the IC 103 and the substrate upper face of the substrate 101 by using a spin coater. A thickness of the applied negative type photosensitive polymer 107 is approximately 3 μm. The negative type photosensitive polymer 107 constitutes an insulating layer that prevents an electric leak brought about between wirings by the Si exposed on the side face of the IC 103 when the wirings described later are formed.

Figure 2C:
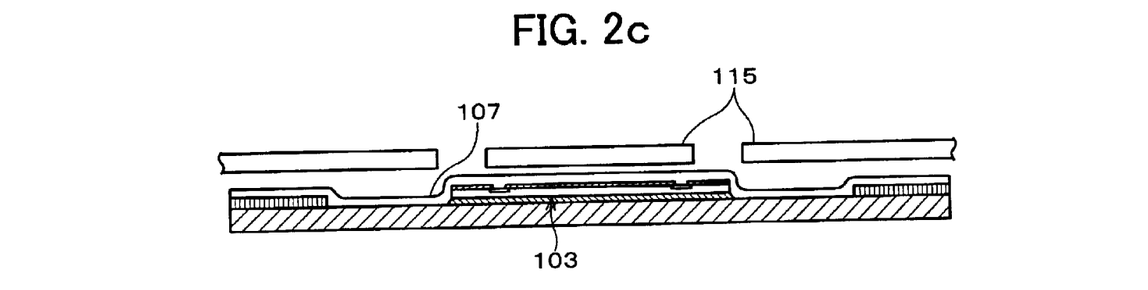

Next, in order to form an insulating film 107a (FIG. 2d) described later so as to cover the Si exposed on the side face of the IC 103, as shown in FIG. 2c, a mask 115 for photolithograph is provided so as to cover the negative type photosensitive polymer 107 other than the side face area of the IC 103. Then, light is irradiated on the negative type photosensitive polymer 107 on the substrate upper face and the IC upper face via the mask 115. After irradiating the light, the mask 115 is removed so as to develop the negative type photosensitive polymer 107 with developer.

At this time, since the negative type photosensitive polymer 107 is used, the negative type photosensitive polymer 107 corresponding to an area that has not been covered by the mask 115 and has been exposed is not removed, and remains on the IC 103 and the substrate 101. While, the negative type photosensitive polymer 107 that has been covered by the mask 115 and has not been exposed is removed from the IC 103 and the substrate 101 by the developer. Thus, as shown in FIG. 2c, the insulating film 107a is formed as an insulating layer so as to cover the side face of the IC 103 in accordance with the exposing process and the developing process.

Note that, in the present embodiment, although the negative type photosensitive polymer is used as a photosensitive polymer in the forming step of the insulating film 107a, a positive type photosensitive polymer may be used. In a case of using the positive type photosensitive polymer, a photosensitive polymer corresponding to an area on which the light is irradiated is removed by the developing process. Thus, in a case where the positive type photosensitive polymer is entirely applied to the IC upper face of the IC 103 and the substrate upper face of the substrate 101, a mask is provided so that the photosensitive polymer corresponding to an area in which the insulating film 107a is formed is not exposed.

Figure 2D:
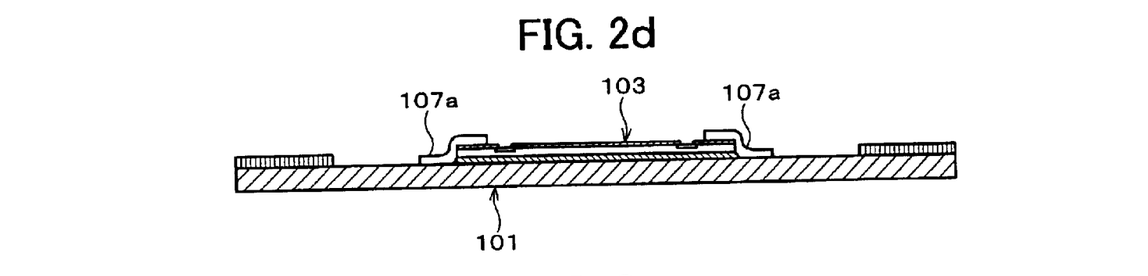

Further, it is preferable to design the mask 115 by considering (a) positional deviation of the mask 115 brought about upon providing the mask 115 on the substrate upper face and the IC upper face and (b) deviation brought about by diffraction of the light irradiation. That is, it is preferable to design the mask 115 so that the insulating film 107a covers not only the side face of the IC 103 but also the substrate upper face of the substrate 101 while extending from the IC upper face via the side face of the IC 103 as shown in FIG. 2d.

Figure 2E:
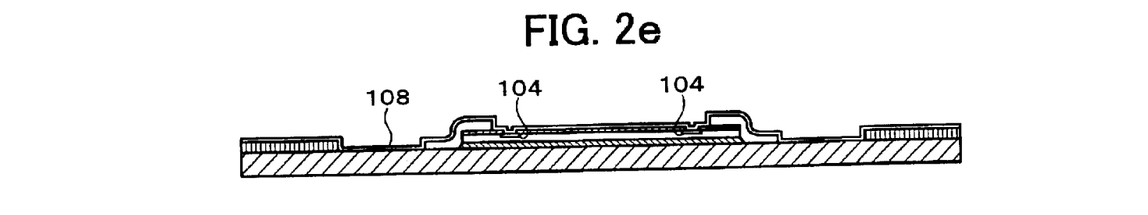
FIG. 2e illustrates a manufacturing step of the semiconductor device of the present invention, and is a cross sectional view for illustrating a step of forming a metallic thin film.

When the insulating film 107a is formed in the foregoing manner, as shown in FIG. 2e, a metallic thin film 108, a metallic film, is further formed on an entire surface constituted of the substrate upper face and the IC upper face. The metallic thin film 108 is made up of, for example, a titanium tungsten (TiW) film and a copper deposition (Cu) film on the TiW film. In this case, first, the TiW film is formed so as to have an approximately 0.1 μm in accordance with sputtering, and the copper (Cu) deposition film is deposited on the TiW so as to have an approximately 0.2 μm in accordance with deposition, so that the metallic thin film 108 is formed. The TiW film prevents Al of the electrode pad 104 from diffusing, and also prevents the Cu deposition film on the TiW film from diffusing. In the Cu deposition film, a portion corresponding to a wiring area described later functions as a base metallic film for performing Cu plating.

Next, description is given on a step of forming an opening section 116 (FIG. 3c) that is a wiring area on which a wiring 109 (FIG. 3e) described later is formed. The opening section 116 is formed so as to have (a) an IC 103-side end area of a terminal 102 provided on the substrate upper face of the substrate 101, (b) an area on the substrate upper face sandwiched by the terminal 102 and the IC 103, and (c) an area on the IC upper face in which the electrode pad 104 is provided as shown in FIG. 3c. The opening section 116 corresponds to the wiring area on which the wiring 109 described later is provided.

Figure 3A:
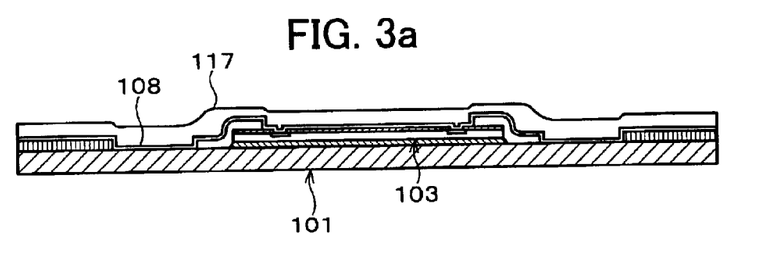
FIG. 3a through FIG. 3c illustrate the manufacturing step of the semiconductor device of the present invention, and each of the figures is a cross sectional view for illustrating a step of forming a coating layer.
Figure 3B:
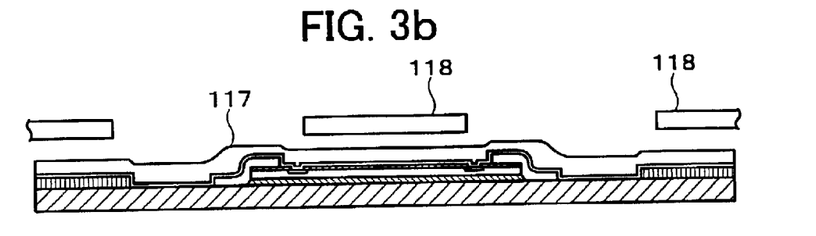
Figure 3C:
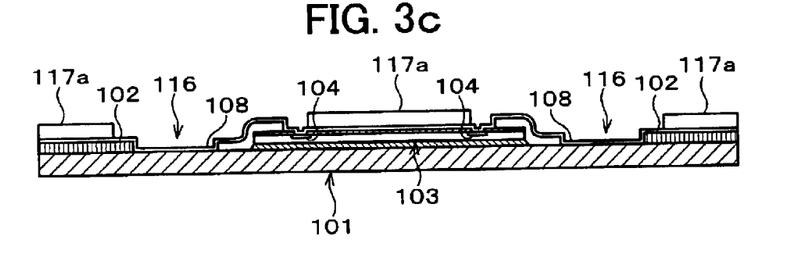

Concretely, first, a positive type photo resist 117 is applied, by using a spin coater, to the substrate upper face and the IC upper face on which the metallic thin film 108 has been provided as shown in FIG. 3a. The applied photo resister 117 has an approximately 10 μm thickness. Next, a mask 118 for photolithography is provided so as to cover the photo resist 117 applied to an area other than an area on which the aforementioned opening section 116 is formed as shown in FIG. 3b. Then, light is irradiated via the mask 118 on the photo resist 117 on the substrate upper face and the IC upper face.

Since the photo resist 117 is positive type, the photo resist 117 corresponding to an exposed area is removed by developer, so that the opening section 116 is formed as shown in FIG. 3c. The metallic thin film 108 of the opening section 116 is a base metallic film for performing Cu plating described later. While, the photo resistor 117 corresponding to an area that has not been exposed on the terminal 102 and the IC 103 remains on the terminal 102 and the IC 103 as the coating layer 117a.

Figure 3D:
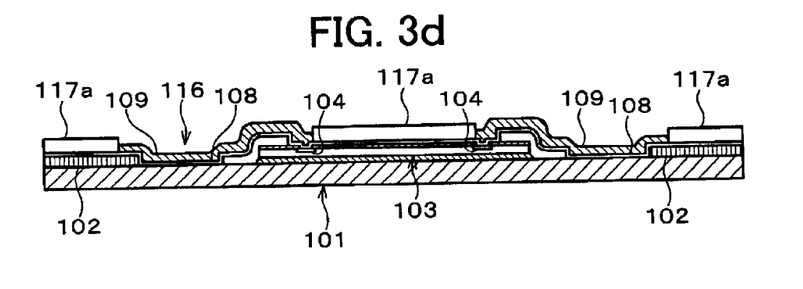
FIG. 3d, FIG. 3e, and FIG. 4a illustrate the manufacturing step of the semiconductor device of the present invention, and each of the figures is a cross sectional view for illustrating a step of forming a wiring.

Next, as shown in FIG. 3d, Cu plating is formed on the opening section 116 in accordance with plating. The Cu plating functions as the wiring 109 that electrically connects the terminal 102 on the substrate 101 to the electrode pad 104 on the IC 103. As to the opening section 116, when the photo resist 117 is removed by the developer, the Cu deposition film of the metallic thin film 108 is exposed. Therefore, soaked in Cu plating solution, the metallic thin film 108 is made conductive as a current film, and Cu grows so as to be deposited on the Cu deposition film of the opening section 116. As a result, the Cu plating is formed so as to entirely cover the opening section 116, so that the Cu plating functions as the wiring 109. The formed wiring 109 has an approximately 5 μm thickness.

While, in an area where the coating layer 117a covers the metallic thin film 108, the Cu deposition film of the metallic thin film 108 is not exposed, so that the Cu plating is not formed even when soaked in the Cu plating solution.

Note that, the foregoing step may be realized by further performing nickel (Ni) plating on the wiring 109 formed on the opening section 116. Although detail description thereof is omitted, it is possible to heighten a conjugant property with respect to solder by performing the Au plating on the Ni plating. Note that, the Ni plating functions as a barrier layer which prevents mutual diffusion of (a) Cu of the wiring 109 and (b) the solder with the Ni plating therebetween. The Ni plating has, for example, an approximately 3 μm thickness. Further, as the Cu plating method, electroplating is used, but electroless plating may be used.

Figure 3E:
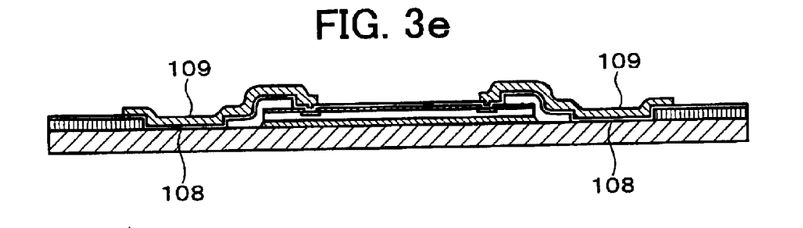

Next, a photo resist remaining as the coating layer 117a is removed by remover. When the coating layer 117a is removed, as shown in FIG. 3e, the wiring 109 made of the Cu plating is electrically connected to the metallic thin film 108 formed on the opening section 116.

Figure 4A:
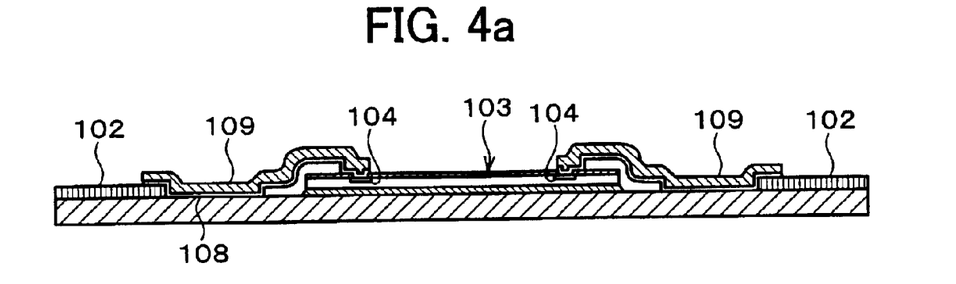

Further, the Cu deposition film and the TiW that constitute the metallic thin film 108 deposited on the IC upper face of the IC 103 and the terminal 102 are removed, as shown in FIG. 4a, by using etchant of Cu and etchant of TiW. At this time, the wiring 109 constituted of the Cu plating is subjected to etching in accordance with the etchant of Cu.

However, since the Cu plating is much thicker than the Cu deposition film, a function of the wiring 109 is not damaged by the etching. That is, the wiring 109 covers the metallic thin film 108 formed on the opening section 116, and electrically connects the electrode pad 104 to the terminal 102.

Figure 4B:
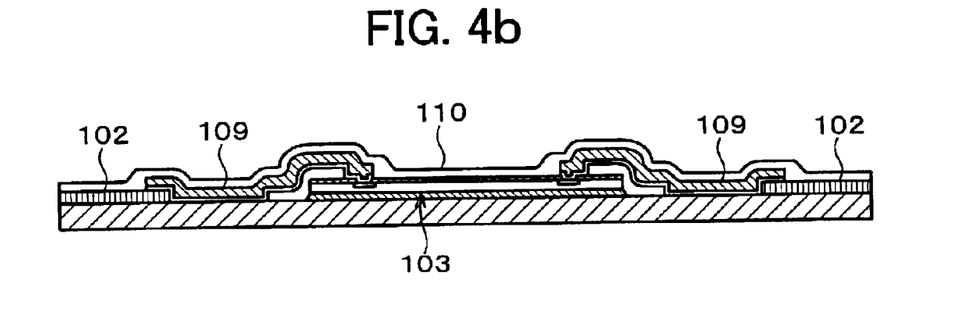
FIG. 4b through FIG. 4d illustrate the manufacturing step of the semiconductor device of the present invention, and each of the figures is a cross sectional view for illustrating a step of forming a protective film.
Figure 4C:
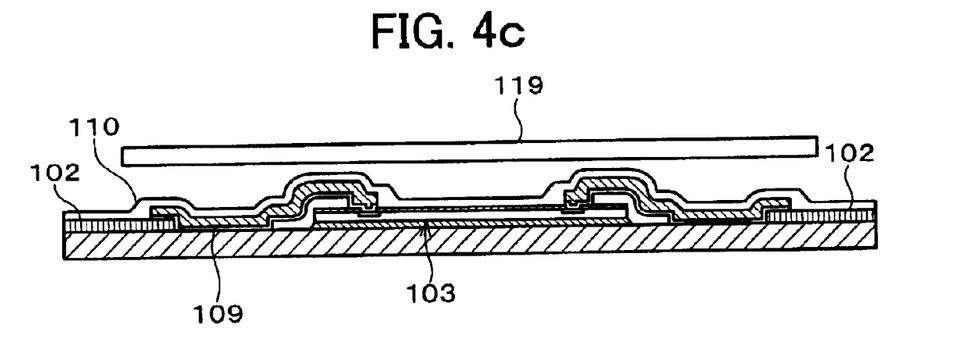
Figure 4D:
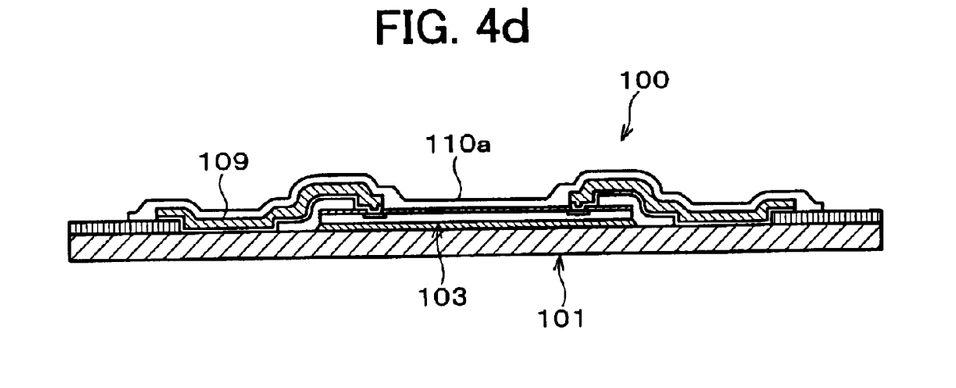

Further, in order to protect the IC upper face of the IC 103 and the wiring 109, as shown in FIG. 4*b*, positive type photosensitive polymer 110 is applied to the terminal 102, the IC 103, and the wiring 109 by using the spin coater. A thickness of the applied positive type photosensitive polymer 110 is approximately 5 μm. Next, as shown in FIG. 4*c*, the mask 119 is disposed so as to cover the wiring 109 and the IC upper face. Light is irradiated via the mask 119 on the terminal 102, the IC 103, and the wiring 109, so as to perform the developer processing. A part of the positive type photosensitive polymer 110, that has not been covered by the mask 111 so as to be exposed, is removed by perform the developer processing, and this brought about a semiconductor device 100 in which a protective film 10*a* is provided so as to cover the wiring 109 and the IC upper face of the IC 103 as shown in FIG. 4*d*.

Note that, the positive type photo resist 117 and the positive type photosensitive polymer 110 are used to form the opening section 116 and the protective film 110*a*, but a negative type photo resist or a negative type photosensitive polymer may be used. In this case, the masks 118 and 119 are designed so that an area in which the photo resist or the photosensitive polymer is removed is not exposed.

In this manner, the IC 103 is fixed on the substrate 101, and the photolithography process and the plating process are performed, so that there is provided the wiring 109 that electrically connects the substrate 101 to the IC 103. Thus, it is possible to further simplify the manufacturing method of the semiconductor device 100 compared with conventional methods. Further, the manufacturing method of the semiconductor device 100 is simplified, so that a time taken to manufacture the semiconductor device 100 is reduced. Thus, it is possible to reduce a manufacturing cost.

Figure 1A:
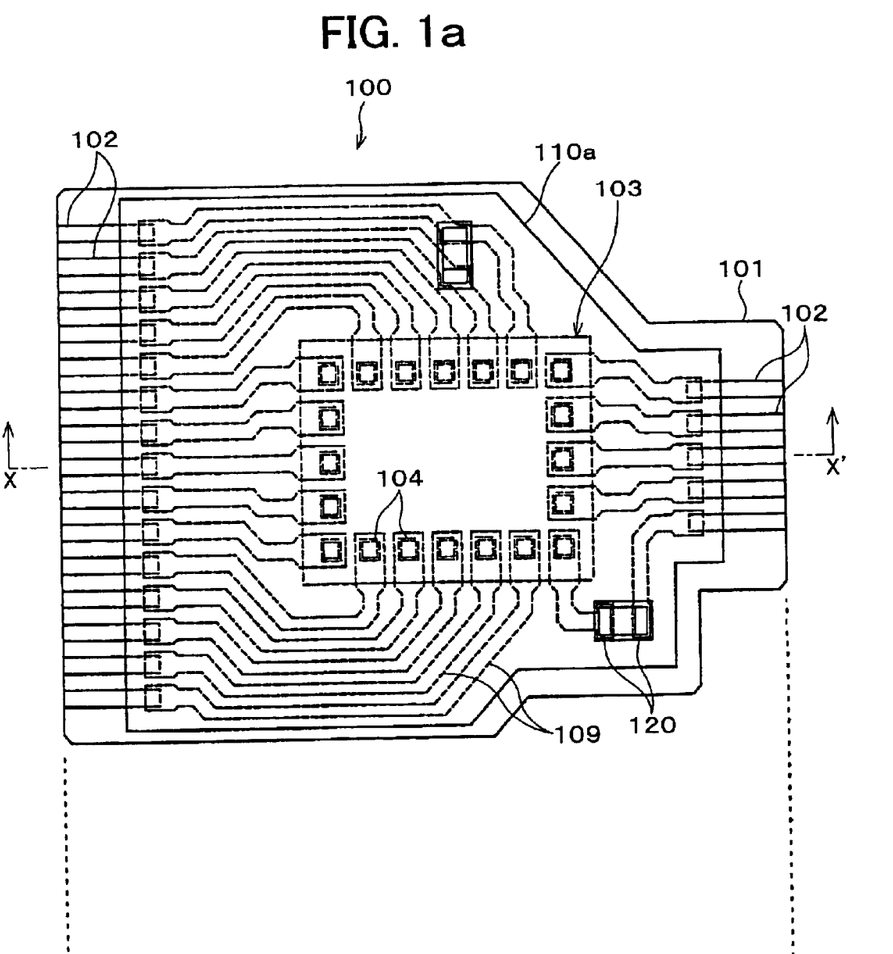
FIG. 1a is a plan view showing one embodiment of a semiconductor device of the present invention.
Figure 1B:
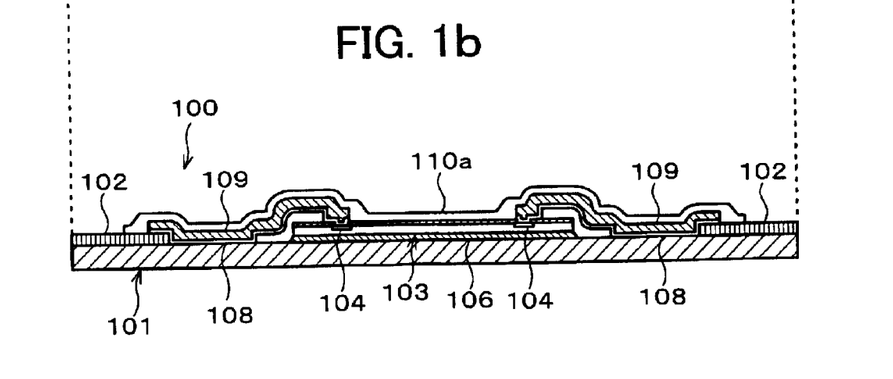
FIG. 1b shows one embodiment of the semiconductor device of the present invention and is a cross sectional view taken along line X–X' of FIG. 1a FIG. 2a illustrates a manufacturing step of the semiconductor device of the present invention, and is a cross sectional view for illustrating a step of bonding and fixing a semiconductor integrated circuit to a substrate.

The semiconductor device 100 manufactured in accordance with the foregoing steps is such that the IC 103 is bonded and fixed to the substrate upper face of the substrate 101 via the adhesive 106 as shown in FIG. 1*b*. The electrode pad 104 formed on the IC upper face is electrically connected via the wiring 109 constituted of the Cu plating on the metallic thin film 108 to the terminal 102 provided on the substrate upper face. Further, there is provided the protective film 110*a* for protecting surfaces of the wiring 109 and the IC 103.

Further, a discrete electric part 120 other than the IC 103 is disposed on the substrate upper face of the substrate 101 as shown in FIG. 1*a*, and is electrically connected to the IC 103 via the wiring 109 as required.

Figure 5:
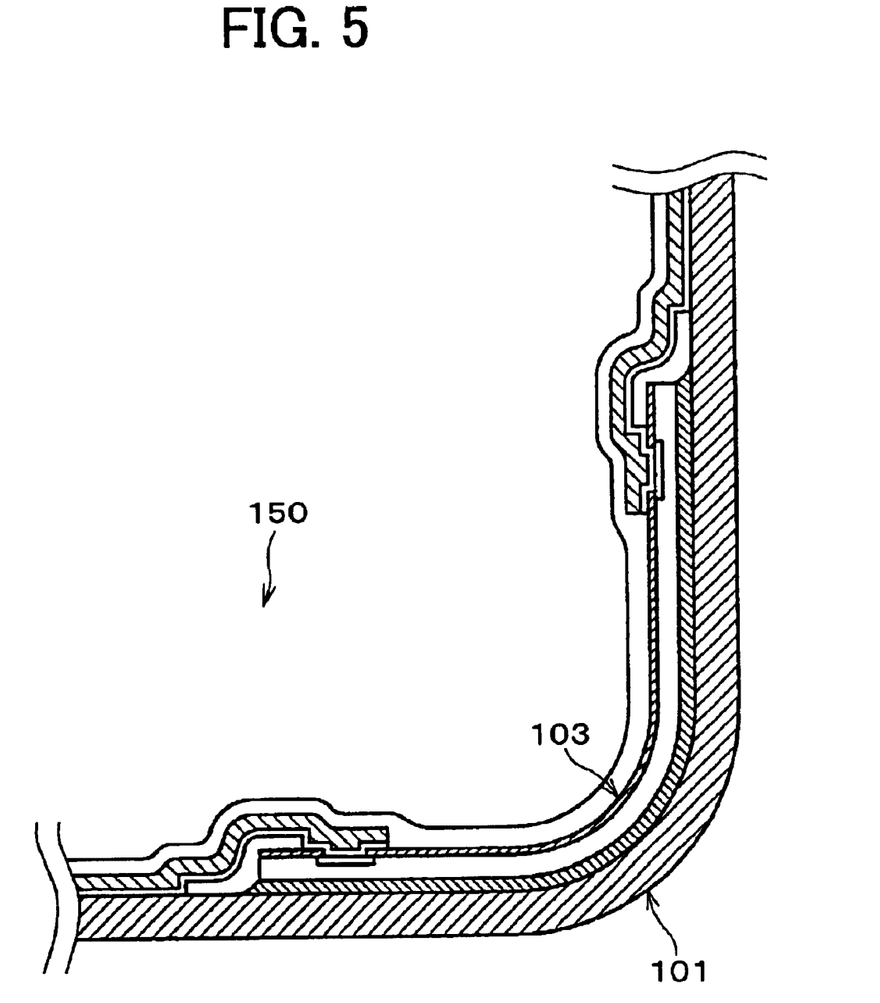
FIG. 5 is a cross sectional view in a case where the semiconductor device of the present invention is bent.
Figure 6:
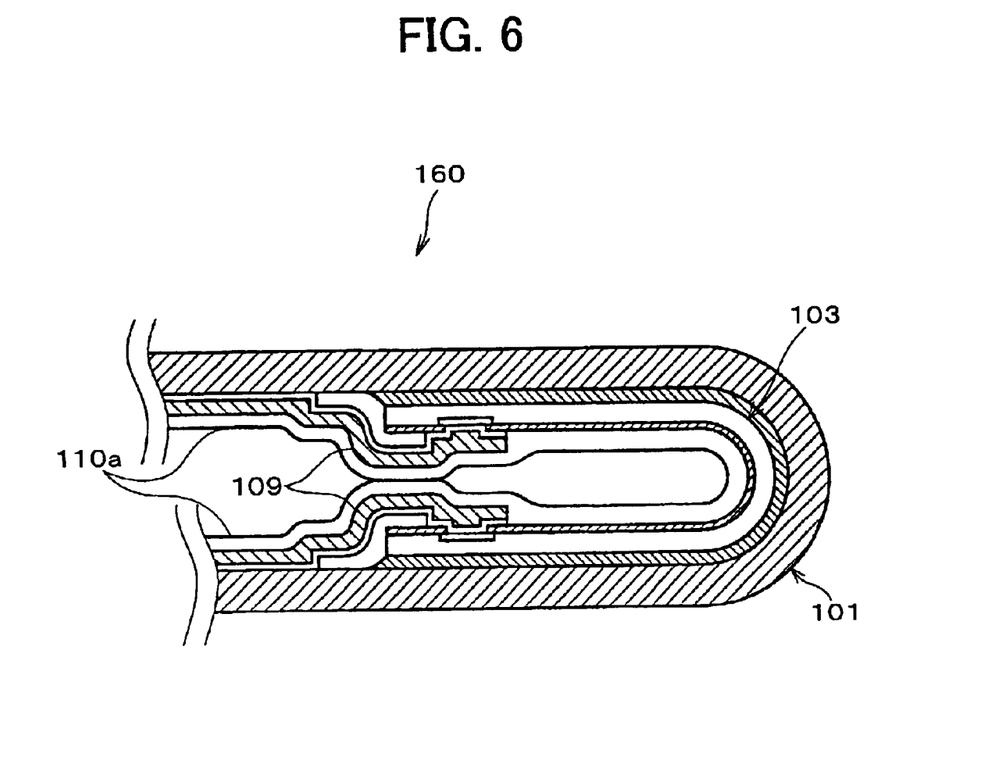
FIG. 6 is a cross sectional view in the case where the semiconductor device of the present invention is bent.

The semiconductor device 100 can be freely bent because the semiconductor device 100 includes the substrate 101 and the IC 103 that have the flexibility. For example, the semiconductor device 100 is bent at a central portion of the IC 103 as shown in FIG. 1*b*, so that it is possible to obtain a semiconductor device 150 bent approximately 90° as shown in FIG. 5. Further, it is also possible to obtain a semiconductor device 160 such that, as shown in FIG. 6, the semiconductor device 100 is bent so that one end of the protective film 110*a* formed on the wiring 109 touches another end of the protective film 110*a*.

In this manner, the semiconductor device 100 uses the substrate 101 and the IC 103 that are superior in the flexibility, so that it is possible to bend the semiconductor device 100 at arbitrary portions. Thus, instead of providing a plate-shaped semiconductor device 100 as shown in FIG. 1*b* in a compact portable electric device, there are provided the bent semiconductor devices 150 and 160 as shown in FIG. 5 or FIG. 6, so that it is possible to efficiently use a limited space in the electric device, and it is possible to further miniaturize the electric device.

[Embodiment 2]

Figure 7A:
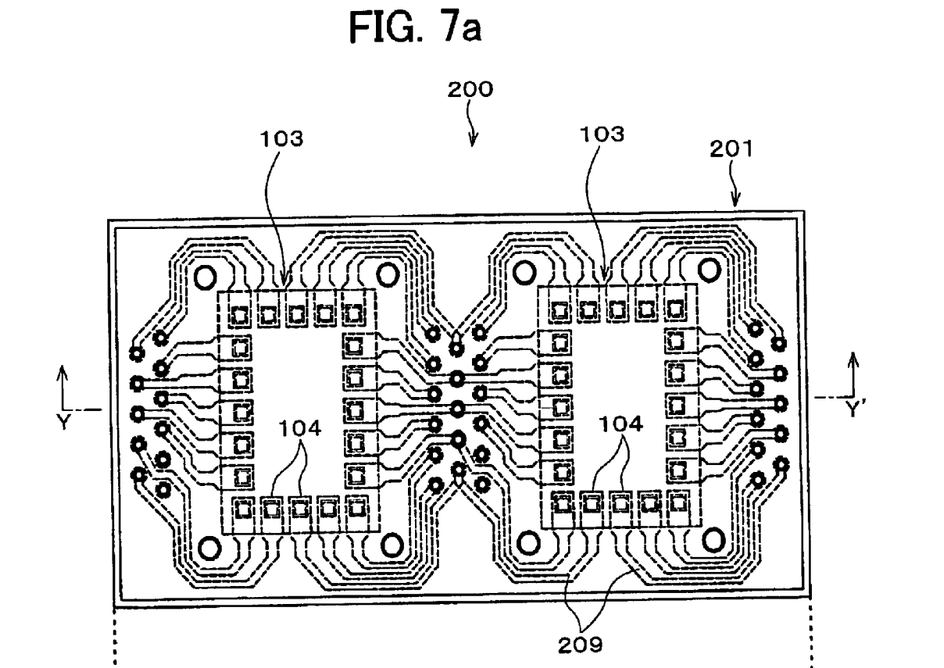
FIG. 7a is a plan view showing another embodiment of the semiconductor device of the present invention.
Figure 7B:
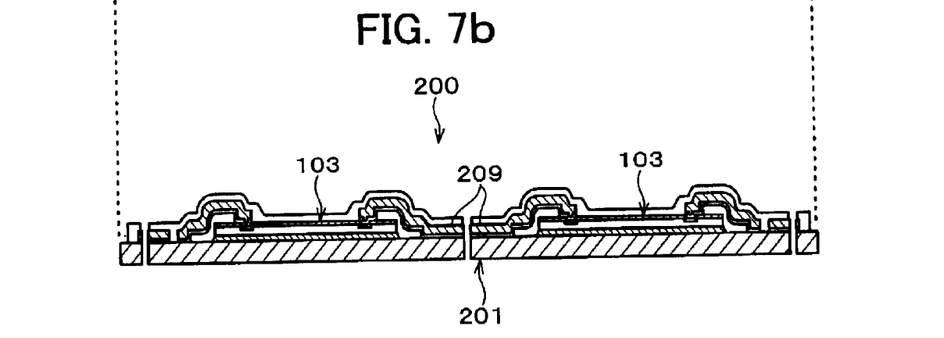

Another embodiment of the present invention is described as follows based on FIGS. 7*a* and 7*b*. Note that, the same reference signs are given to members having the same functions as the members shown in Embodiment 1 and corresponding figures, and description thereof is omitted for convenience.

A semiconductor device 200 of the present embodiment is manufactured in accordance with the steps described in Embodiment 1. That is, as shown in FIG. 7*b*, two ICs 103 are bonded and fixed to a surface of a substrate 201, and the photolithography process and the plating process are performed, so that the semiconductor device 200 is manufactured. A wiring 209 formed in accordance with the plating process electrically connects one electrode pad 104 to another electrode pad 104 both of which are included in each IC 103 as shown in FIG. 7*a*, and electrically connects an electrode pad 104 other than the foregoing electrode pads 104 to a connection terminal.

Thus, even in a case where a plurality of ICs 103 are provided on the semiconductor device 200, it is possible to easily manufacture the semiconductor device 200 in accordance with the photolithography process and the plating process in which the photosensitive polymer and the photo resister are used.

Further, since each IC 103 has the flexibility, it is possible to bend the IC 103 at arbitrary portions. Therefore, even in a case where the plurality of ICs 103 are disposed on the substrate 201, the substrate 201 is not used as a plate-shaped substrate without being bent, but is used so as to be freely bent, so that it is possible to efficiently use a space in the electric device. Thus, it is possible to miniaturize the electric device.

Note that, the semiconductor device 200 is arranged so that the two ICs 103 of the same kind are provided, but is not limited to this arrangement, and ICs of different kinds may be provided. Further, three or more ICs may be provided. Further, discrete electric parts other than the IC may be provided on the substrate 201 of the semiconductor device 200. In this case, there is formed a wiring that electrically connects the IC and the substrate to the discrete electric parts as required.

[Embodiment 3]

Another embodiment of the present invention is described as follows based on FIG. 8. Note that, the same reference signs are given to members having the same functions as the members shown in the foregoing embodiments and corresponding figures, and description thereof is omitted for convenience.

Figure 8:
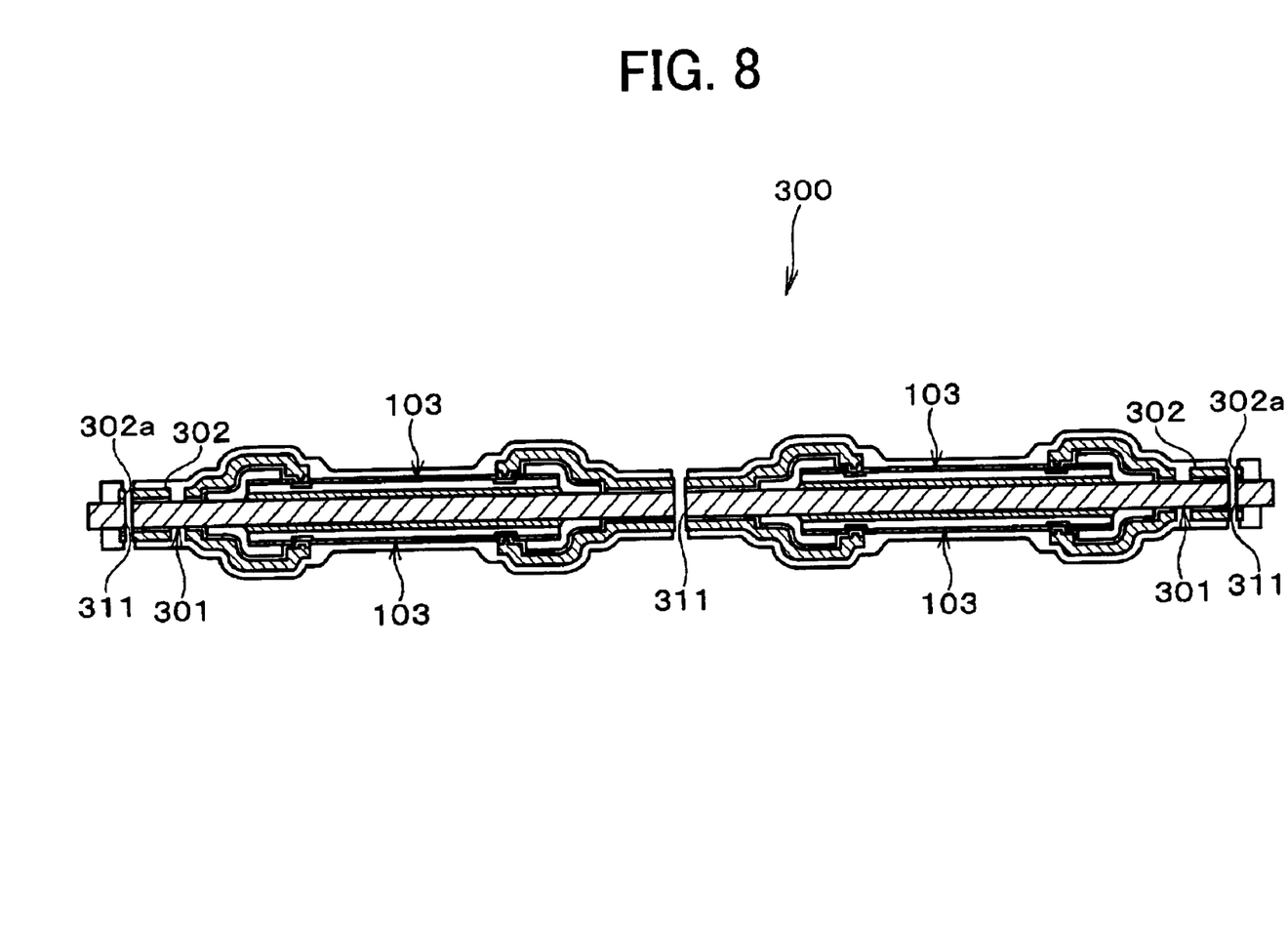
FIG. 8 is a cross sectional view showing still another embodiment of the semiconductor device of the present invention.

A semiconductor device 300 is arranged so that two ICs 103 are provided on both sides of a substrate 301 as shown in FIG. 8. A hole 311 that runs through the substrate 301 is provided in the substrate 301. A connection terminal 302 provided on the substrate 301 is subjected to patterning so as to form a terminal hole 302*a* in the hole 311.

In the ICs 103 provided on the both sides of the substrate 301, the ICs 103 provided on the same side are electrically connected to each other by the wiring 209 (see FIG. 7*a*) as described in Embodiment 2. While, the ICs 103 provided on the different sides can be electrically connected to each other by a conductive body (not shown) that fills the hole 311 and the terminal hole 302a.

Note that, in the semiconductor device 300, the two ICs 103 of the same kind are provided on each side, but the ICs 103 of different kinds may be provided. Further, at least one or more ICs are provided on each side of the substrate 301, and the ICs may have the same function, or may have partially or entirely different functions.

[Embodiment 4]

Another embodiment of the present invention is described as follows.

Figure 9A:
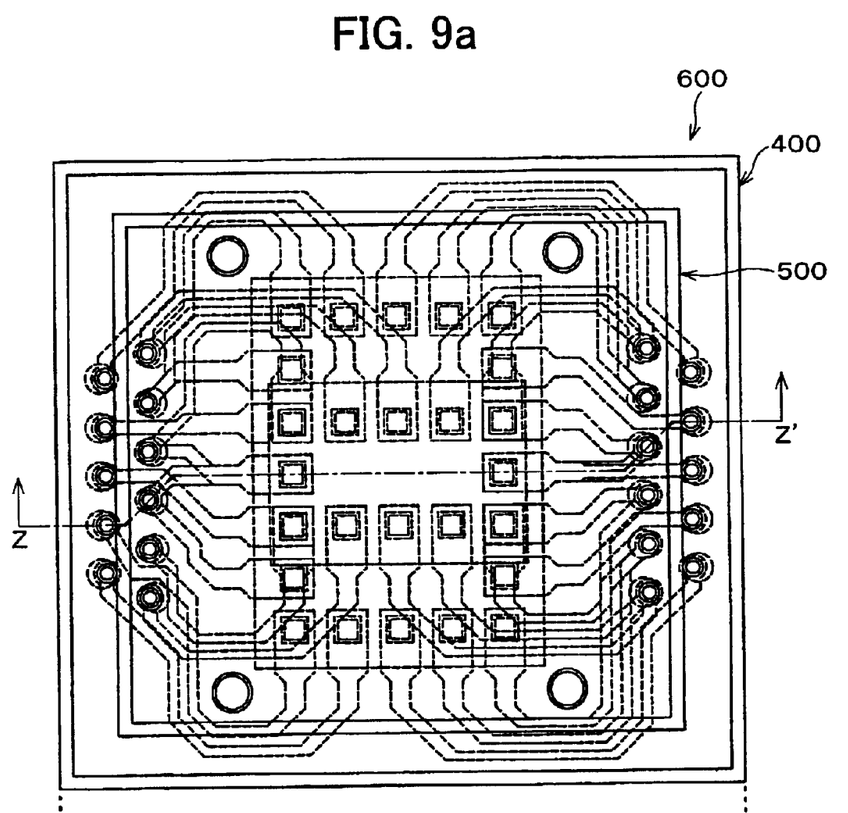
FIG. 9a is a plan view showing a stacked type semiconductor device of the present invention.
Figure 9B:
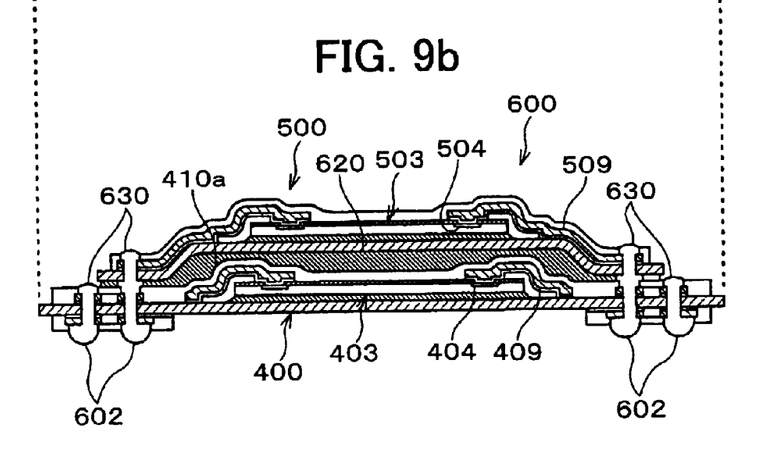
Figure 10A:
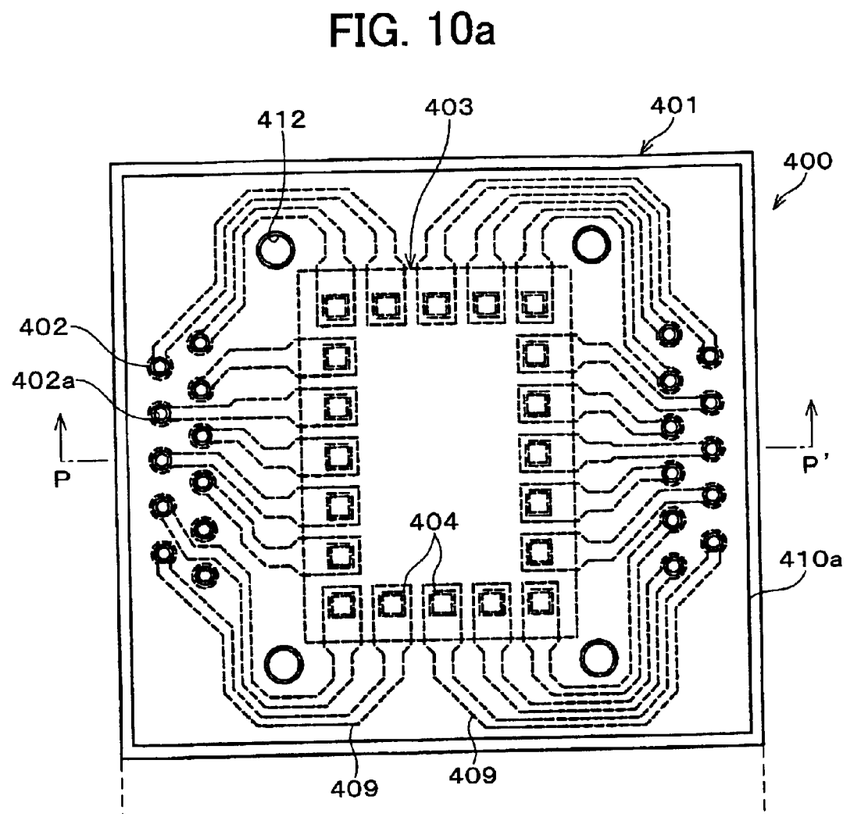
FIG. 10a is a plan view showing a first semiconductor device that constitutes the stacked type semiconductor device of the present invention.
Figure 10B:
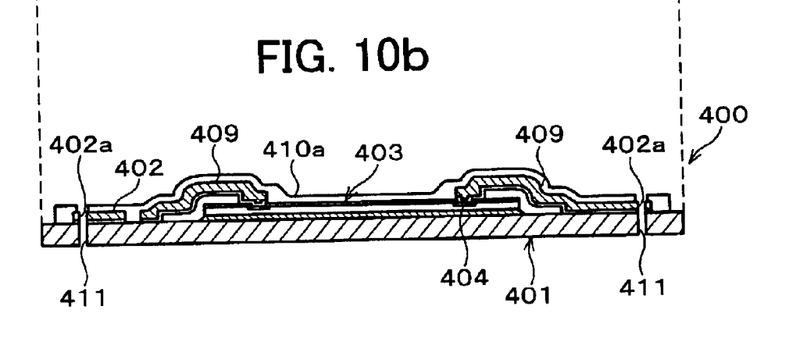
Figure 11A:
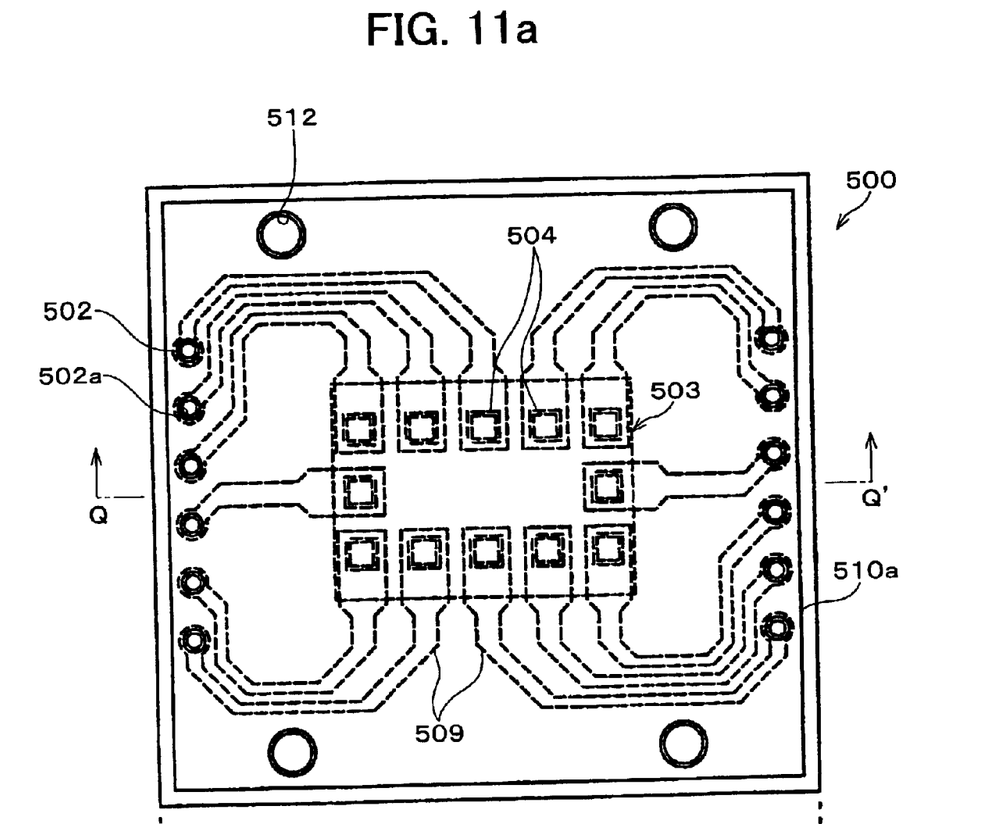
FIG. 11a is a plan view showing a second semiconductor device that constitutes the stacked type semiconductor device of the present invention.
Figure 11B:
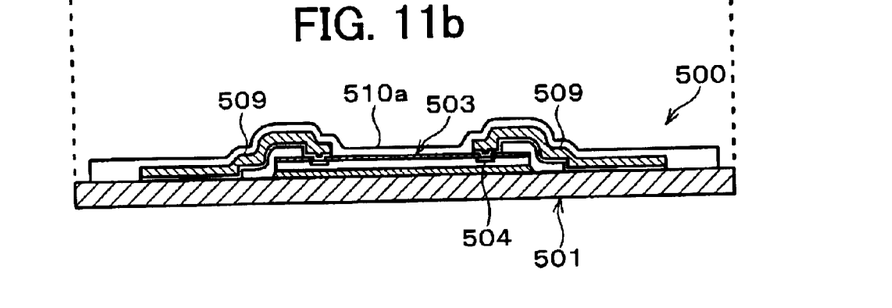

A stacked type semiconductor device 600 of the present embodiment is arranged so that a second semiconductor device 500 shown in FIG. 11b is stacked on a first semiconductor device 400 shown in FIG. 10b in a manner shown in FIG. 9b. The first semiconductor device 400 and the second semiconductor device 500 are manufactured in accordance with the steps described in Embodiment 1.

The first semiconductor device 400 includes an IC 403 provided on a substrate 401 as shown in FIG. 10b. In the substrate 401, there are provided a connection terminal 402, a hole 411, and a positioning hole 412 shown in FIG. 10a. The connection terminal 402 is provided in accordance with patterning performed with respect to the substrate 401, and a terminal hole 402a is formed in the hole 411. Further, an electrode pad 404 provided on the IC 403 is electrically connected to the terminal 402 by a wiring 409 provided in accordance with the plating process described in Embodiment 1. Further, a protective film 410a is provided so as to cover the IC 403, the wiring 409, and the terminal 402.

The second semiconductor device 500 includes an IC 503 provided on a substrate 501 as shown in FIG. 11b. In the substrate 501, there are provided a connection terminal 502 shown in FIG. 11a, a positioning hole 512, and a hole (not shown), and the connection terminal 502 constitutes a terminal hole 502a in the hole of the substrate 501. The electrode pad 504 provided on the IC 503 is connected to the terminal 502 by the wiring 509. Further, a protective film 510a is provided so as to cover the IC 503, the wiring 509, and the terminal 502.

The first semiconductor device 400 and the second semiconductor device 500 are positioned in accordance with the positioning holes 412 and 512 as shown in FIG. 9a, and the second semiconductor device 500 is stacked on the first semiconductor device 400 as shown in FIG. 9a, so that it is possible to obtain the stacked type semiconductor device 600. At this time, as shown in FIG. 9b, the protective film 410a of the first semiconductor device 400 is connected to the substrate 501 by an adhesive 620 so that the connected side of the second semiconductor device 500 has no IC 503. Further, in the present embodiment, end portions of the second semiconductor device 500 is bent as shown in FIG. 9b so that the hole 411 of the first semiconductor device 400 corresponds to the hole provided in the substrate 501 of the second semiconductor device 500.

Further, as shown in FIG. 9b, a conductive body 630 is provided so as to fill the hole 411 and the hole provided in the substrate 501, and so as to fill the terminal holes 402a and 502a shown in FIG. 10b and FIG. 11b. The ICs 403 and 503 are electrically connected to each other via the conductive body 630. Further, the conductive body 630 is connected to the outside at the terminal 602. Thus, the stacked type semiconductor device 600 can provide a signal and a voltage from the terminal 602 via the conductive body 630 and the wirings 409 and 509 to the electrode pads 404 and 504.

Note that, the stacked type semiconductor device 600 may be arranged so that two or more semiconductor devices are stacked, and may be arranged so that semiconductor devices each of which has a plurality of ICs on its substrate are stacked.

As described above, a manufacturing method of a semiconductor device of the present invention is arranged as follows: in a metallic film forming step, an entire surface of the semiconductor integrated circuit and the substrate is covered with a metallic film, and a coating layer that covers the metallic film except for the wiring area is provided, so as to provide the base metallic film, and in a wiring forming step, the plating is performed, and the coating layer and the metallic film except for the wiring area are removed, so as to provide the wiring.

According to the method, in the metallic film formed on the entire surface of the semiconductor integrated circuit and the substrate, a portion covering an area other than the wiring area is further covered with the coating layer, so that only the metallic film of the wiring area is exposed, and the metallic film of the wiring area is used as the base metallic film. Thus, it is possible to readily form the base metallic film of the wiring area. Further, the metallic film except for the wiring area is covered with the coating layer, so that plating in the wiring forming step does not cause the plating metal to be deposited on the metallic film except for the wiring area. Further, after the plating is performed, the coating layer and the metallic film except for the wiring area are removed. Therefore, it is possible to readily provide the wiring on the base metallic film of the wiring area.

Further, the semiconductor device of the present invention is arranged so that the substrate and the semiconductor integrated circuit are bendable.

According to the arrangement, it is possible to bend the substrate and the semiconductor integrated circuit at arbitrary portions. Thus, in a case where the semiconductor device is provided in a miniature portable electric device, it is possible to bend the semiconductor device so that a limited space in the electric device can be efficiently used. Thus, it is possible to realize high performance and miniaturization of the electric device.

Further, the semiconductor device of the present invention is arranged so that the semiconductor integrated circuits are fixed on both sides of the substrate of the semiconductor device.

According to the invention, even in a case where a plurality of semiconductor integrated circuits are fixed on the substrate, it is possible to form the wiring that connects an electrode to a connection member in accordance with plating. Thus, it is possible to obtain the semiconductor device that can be easily manufactured.

Further, the stacked type semiconductor device of the present invention includes the semiconductor devices in plurality, wherein there is provided a conductive body that is electrically connected to the connection member of each of the semiconductor devices, and the semiconductor devices are electrically connected to each other via the conductive body.

According to the arrangement, even in a case where the plurality of semiconductor devices are provided in the electric device, a limited space in the electric device can be efficiently used, so that it is possible to miniaturize the electric device.

Further, the stacked type semiconductor device of the present invention is arranged so that a positioning hole is provided in each of the semiconductor devices, and the semiconductor devices are positioned in accordance with the positioning hole so as to be stacked.

According to the arrangement, the positioning hole is provided in each semiconductor device, so that it is possible to determine a position, at which the semiconductor devices are stacked, by making the positioning holes correspond to each other. Thus, it is possible to readily stack the semiconductor devices.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:

a substrate whose formation side has a connection member thereon;

a semiconductor integrated circuit, including an electrode and covered with an insulating layer except for an electrode area including the electrode, which is fixed on the formation side so that the electrode area is exposed;

a plating wiring that is formed in accordance with plating so as to electrically connect the electrode to the connection member; and wherein the plating wiring is located at least partially over each of the electrode of the semiconductor integrated circuit and the connection member, and wherein a base metallic film is located between: (a) the plating wiring, and (b) each of the electrode and the connection member.

2. The semiconductor device as set forth in claim 1, wherein the substrate and the semiconductor integrated circuit is bendable.

3. The semiconductor device as set forth in claim 1, further comprising a protective film that covers the semiconductor integrated circuit and the wiring.

4. The semiconductor device of claim 1, wherein the base metallic film comprises TiW.

5. The semiconductor device of claim 4, wherein the base metallic film further includes a Cu deposition film.

6. The semiconductor device of claim 1, wherein the plating wiring provided over the base metallic film comprises Cu plating.

7. The semiconductor device of claim 1, wherein the plating wiring comprises Cu plating formed by a Cu plating process using a Cu plating solution.

8. A semiconductor device comprising:

a substrate whose formation side has a connection terminal thereon;

a semiconductor integrated circuit including an electrode pad;

an insulating layer which covers the semiconductor integrated circuit except for a pad area where the electrode pad is located, so that the electrode pad is at least partially exposed through the insulating layer; and a thin film comprising metal and a Cu plating each provided at least partially over and electrically connecting the electrode pad of the semiconductor integrated circuit and the connection terminal.

9. The semiconductor device of claim 8, wherein a portion of the thin film comprising metal contacts the substrate in an area between the connection terminal and the electrode pad, so that said area where the thin film comprising metal contacts the substrate is where the connection terminal and the electrode pad are separated from one another.

* * * * *